(12) United States Patent
Forrest

(10) Patent No.: US 9,328,421 B2
(45) Date of Patent: May 3, 2016

(54) ORGANIC VAPOR JET PRINTING SYSTEM

(71) Applicant: The Regents of the University of Michigan, Ann Arbor, MI (US)

(72) Inventor: Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/621,918

(22) Filed: Sep. 18, 2012

(65) Prior Publication Data

US 2013/0081571 A1  Apr. 4, 2013

Related U.S. Application Data

(60) Division of application No. 12/389,628, filed on Feb. 20, 2009, now Pat. No. 8,293,329, which is a continuation-in-part of application No. 12/034,863, filed on Feb. 21, 2008, now abandoned.

(51) Int. Cl.
| | |
|---|---|
| C23C 16/00 | (2006.01) |
| C23C 16/46 | (2006.01) |
| C23C 14/04 | (2006.01) |
| C23C 14/12 | (2006.01) |
| C23C 14/22 | (2006.01) |
| H01L 51/00 | (2006.01) |

(52) U.S. Cl.
CPC .............. *C23C 16/463* (2013.01); *C23C 14/04* (2013.01); *C23C 14/12* (2013.01); *C23C 14/228* (2013.01); *H01L 51/0004* (2013.01); *H01L 51/0005* (2013.01)

(58) Field of Classification Search
USPC ................................. 118/726, 727
See application file for complete search history.

(56) References Cited

U.S. PATENT DOCUMENTS

| | | | | |
|---|---|---|---|---|
| 2,939,943 | A * | 6/1960 | Walter | ........ 219/76.14 |
| 3,802,804 | A * | 4/1974 | Zimmermann | ........ 417/360 |
| 4,692,305 | A | 9/1987 | Rangaswamy et al. | |
| 5,652,877 | A | 7/1997 | Dubois et al. | |
| 5,972,117 | A * | 10/1999 | Schmitt | ........ 118/726 |
| 6,013,135 | A * | 1/2000 | Kaun et al. | ........ 118/726 |
| 6,056,998 | A * | 5/2000 | Fujimoto | ........ 427/240 |
| 6,514,569 | B1 * | 2/2003 | Crouch | ........ 427/96.2 |
| 6,533,285 | B2 | 3/2003 | Nava et al. | |
| 6,749,951 | B1 | 6/2004 | Darolia et al. | |
| 7,670,406 | B2 | 3/2010 | Belashchenko | |
| 8,337,584 | B2 | 12/2012 | Billieres et al. | |
| 2003/0224107 | A1 * | 12/2003 | Lindfors et al. | ........ 427/255.28 |
| 2004/0048000 | A1 | 3/2004 | Shtein et al. | |
| 2004/0237892 | A1 * | 12/2004 | Basceri et al. | ........ 118/715 |
| 2005/0226955 | A1 | 10/2005 | Yuasa et al. | |
| 2006/0035470 | A1 * | 2/2006 | Horii et al. | ........ 438/758 |
| 2006/0075965 | A1 * | 4/2006 | Lee et al. | ........ 118/683 |
| 2007/0144621 | A1 | 6/2007 | Farmer et al. | |
| 2008/0257200 | A1 | 10/2008 | Minevski et al. | |
| 2009/0214782 | A1 | 8/2009 | Forrest et al. | |

OTHER PUBLICATIONS

The International Search Report corresponding to the PCT/US2009/034482 application mailed Nov. 27, 2009.
Astle et al., "Theoretical and Experimental Performance of a High Frequency Gas Micropump" Sensors and Actuators A, Elsevier Sequoia, vol. 134, No. 1, Feb. 28, 2007, pp. 245-256.
U.S. Appl. No. 60/965,117, filed Aug. 16, 2007.

* cited by examiner

*Primary Examiner* — Keath Chen
(74) *Attorney, Agent, or Firm* — Riverside Law LLP

(57) ABSTRACT

An organic vapor jet printing system includes a pump for increasing the pressure of an organic flux.

15 Claims, 5 Drawing Sheets

ORGANIC VAPOR JET PRINTING SYSTEM

CROSS-REFERENCE TO RELATED APPLICATION

This application is a divisional of U.S. application Ser. No. 12/389,628, filed Feb. 20, 2009, which is a continuation-in-part of U.S. application Ser. No. 12/034,863, filed Feb. 21, 2008, the disclosures of which are incorporated by reference in their entireties.

GOVERNMENT RIGHTS

This invention was made with government support under Contract Number DE-FC26-04NT42273, awarded by the Department of Energy. The government has certain rights in the invention.

RESEARCH AGREEMENTS

The claimed invention was made by, on behalf of, and/or in connection with one or more of the following parties to a joint university-corporation research agreement: Princeton University, The University of Southern California, The Regents of the University of Michigan and Universal Display Corporation. The agreement was in effect on and before the date the claimed invention was made, and the claimed invention was made as a result of activities undertaken within the scope of the agreement.

BACKGROUND OF THE INVENTION

1. Field of the Invention

The present invention relates to a system for the deposition of organic films. In particular, the invention relates to a system for the deposition of organic films on substrates by jet printing, where the films may be neat or a mixture of organic materials, such us a host/dopant mixture.

2. Background Information

Thin films of organic materials are used for a variety of organic electronics, such as photovoltaics, organic light emitting devices (OLEDs), and thin film transistors, on research scales and, to a limited extent, on industrial scales. Organic vapor jet printing (OVJP) is a process by which thin organic films may be deposited on a substrate through nozzles. OVJP systems allow localized deposition of organic films on a substrate, typically without the need for masking. It is advantageous to source the OVJP nozzles with a uniform flux (a mixture of organic vapor and a carrier gas) from a source with controllable results.

Organic vapor phase deposition (OVPD) systems, particularly multi-barrel systems, may provide a substantially uniform organic flux with very controllable results. The organic flux of OVPD systems may, e.g., vary by less than 20 mole percent, less than 10 mole percent, or less than 5 mole percent. An example of such a system is found in U.S. Provisional Patent Application Ser. No. 60/965,117, which is expressly incorporated herein in its entirety by reference thereto. Such flux uniformity is desirable in an OVJP system. However, the pressure in OVPD systems may be too low for sourcing OVJP nozzle systems. Contributing to this problem are pressure drops through long run lines between the source (OVPD system) and the nozzles. These pressure drops cause a reduced pressure at the OVJP nozzles, thereby reducing, or potentially preventing, nozzle flow. The pressure drops also cause cold spots in the flux, which may cause premature condensation of the organic flux prior to dispensing from the nozzle. When a relatively low-pressure source, such as an OVPD system, is used, the pressure drops may render the OVJP system inefficient or ineffective.

Another potential problem related to OVJP systems is that the organic material deposited on the substrate may have a profile that resembles a Gaussian curve. In other words, the organic material may significantly taper as the thickness of the film increases, potentially creating a peak of material. It may be advantageous to have a deposition with steeper side walls, i.e., a more "squared" deposition profile in the direction of the nozzle flow. For example, the latter shape may allow a given amount of organic material to be deposited on a smaller area of the substrate, e.g., a silicon wafer. Thus, space on the surface of the substrate may be utilized more efficiently.

BRIEF SUMMARY OF THE INVENTION

According to example embodiments of the present invention, an organic vapor jet printing system includes a heated chamber configured to produce an organic flux, where the flux includes a carrier gas and a vapor of an organic material. A source cell introduces the vapor and the carrier gas into the heated chamber. A nozzle body directs the flux to a substrate and a transport line disposed between the heated chamber and the nozzle body conveys the flux from the heated chamber to the nozzle body. To address the problem of pressure drops and/or cold spots, a pump is connected to the line to increase the pressure of the flux. The system may also include a stage that receives a substrate and translates the substrate with respect to the nozzle body. The stage may cool the substrate to a temperature sufficient to cause deposition of the organic material onto a surface of the substrate, thereby forming an organic film on the substrate. The system may also include a heating element that regulates the temperature within the boated chamber. The nozzle body may include an array of nozzles. The pump may generate pressure pulses in the flux and may include a piston. The piston may be actuated by, e.g., a crank or a solenoid. The pump may include a piezoelectric material. The pump may be a microelectromechanical system (MEMS). The pump may be in a position proximate to the nozzle body. The system may also include a thermal bath to regulate the temperature of the pump. The system may include at least one additional source cell that introduces a vapor of at least one additional organic material into the heated chamber.

According to example embodiments of the present invention, a method of depositing an organic film onto a substrate includes: heating an organic material to form an organic vapor; transporting the organic vapor in a carrier gas from a source cell into a heated chamber; heating the heated chamber sufficiently to form a substantially uniform organic flux of the carrier gas and organic vapor by diffusive mixing of the gas and vapor within the heated chamber; transporting the organic flux to a nozzle body; directing the organic flux to a cooled substrate; increasing the pressure of the organic flux with a pump before the organic flux is directed to the cooled substrate; and depositing the organic material onto a surface of the cooled substrate, thus forming an organic film on the substrate. The pressure may be increased by applying pressure pulses. The pump may be a piston pump, which may be actuated by, e.g., a crank or a solenoid. The pump may be actuated with a piezoelectric material. The pump may be a MEMS pump. The pump may be positioned proximally to the nozzle body. The nozzle body may include an array of nozzles. The method may further include translating the cooled substrate with respect to the nozzle body. The method may include regulating the temperature of the pump with a thermal bath. Moreover, the method may include depositing a plurality of organic materials from a plurality of source cells.

DETAILED DESCRIPTION OF THE INVENTION

As described herein, diffusive mixing includes mixing that is the result of diffusion alone in contrast to, e.g., turbulent mixing. Diffusive mixing requires no artificial mixing, such as that provided by, e.g., a showerhead, propeller, or other turbulent mixing source.

A substantially uniform organic flux includes a mixture of organic vapor and carrier gas in which the concentration of the organic vapor does not vary by more than about 20 mole percent. For example, the concentration of the organic vapor does not vary by more than about 15 mole percent, e.g., the concentration of the organic vapor does not vary by more than about 10 mole percent, the concentration of the organic vapor does not vary by more than about 5 mole percent, etc. Concentration gradients within the flux are substantially absent.

Figure 1:
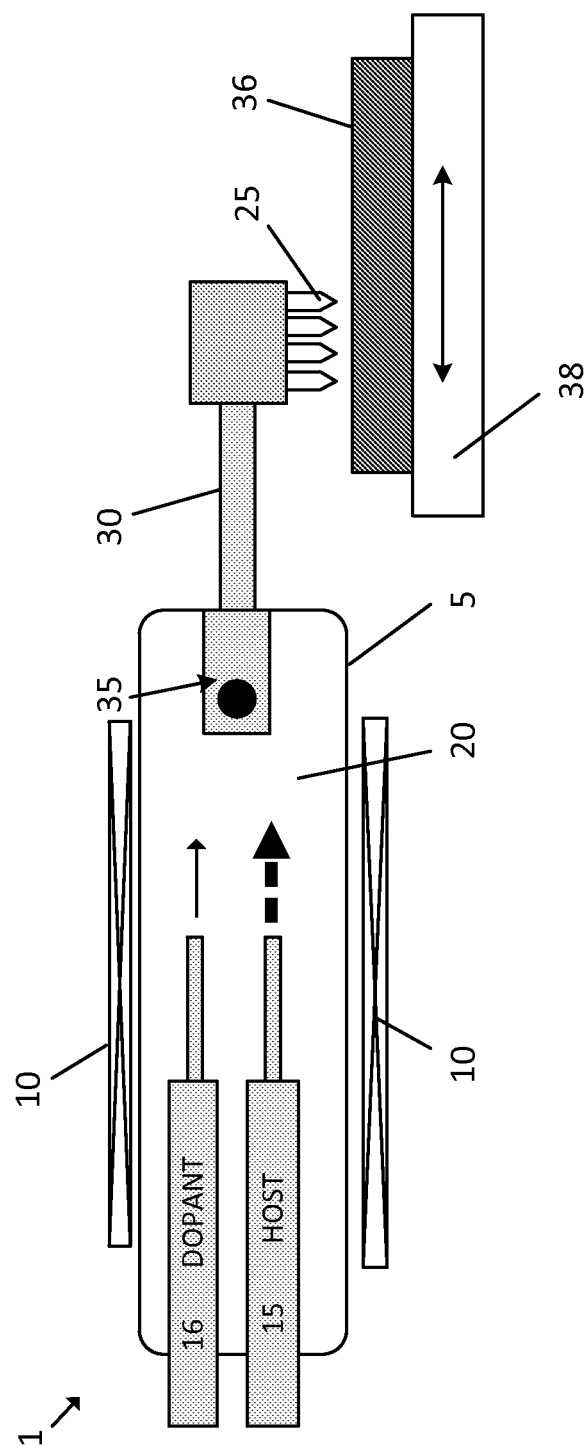
FIG. 1 illustrates an organic vapor jet printing system.

An OVJP system 1 is illustrated in FIG. 1, The OVJP system 1 includes a heated chamber 5. The temperature of the heated chamber 5 is regulated by a heating element 10. Two source cells 15, 16 in the form of barrels each introduce a carrier gas and an organic vapor into the heated chamber 5. It should be appreciated that additional or fewer source cells may be provided. The use of two or more source cells allows for deposition of multiple organic materials into multiple layers, mixed single layers, and the growth of multilayer organic structures. In each source cell 15, 16, an organic material is heated to a temperature higher than the sublimation temperature of the material to form a vapor. The organic vapor is transported from the source cell into the heated chamber 5 by the carrier gas, e.g., an inert carrier gas, such as nitrogen, helium, etc. In this example, the source cell 15 introduces a host, and the source cell 16 introduces a dopant. The source cells 15, 16 may introduce their respective vapor/carrier gas mixtures simultaneously or sequentially. The chamber 5 is heated via the heating element 10 to a temperature that exceeds the condensation temperatures of the organic vapors of both source cells 15, 16. After introduction into the heated chamber 5, the source material(s) and carrier gas(es) are mixed via diffusive mixing, thus generating a substantially uniform organic flux 20. The flux 20 is transported to a nozzle body 25, in this case a nozzle array, via a transport line 30.

To combat pressure drops and cold spots resulting from the transport along the transport line 30, a high temperature pump 35 is connected to the transport line 30. The pump 35, shown schematically in FIG. 1, may be a piston pump actuated by a crank (see FIG. 2), a solenoid, etc. The pump 35 may be actuated by a piezoelectric material. Moreover, the pump 35 may be a MEMS pump. The pump 35 may generate pressure pulses in the flux. By supplying the organic flux 20 to the nozzle body 25 with pulsed pressure, a more squared deposition profile may be obtained than with a constant pressure feed, which tends to create a more Gaussian profile that tapers inwardly with the increasing thickness of the film. The pressure pulses may be readily generated, e.g., with pumps utilizing a reciprocating motion, e.g., a single-action piston pump (see FIG. 2). If a more Gaussian profile is desired, however, the pulses may be reduced by, e.g., providing a multistage pumping with the last stage having is smaller stroke volume, and/or increasing the volume of the flux between the pump and the nozzle body. The latter option reduces the pulsing effect because the ratio of the compression stroke volume to the volume between the pump and the nozzle body is decreased. Thus, each compression stroke (e.g., pulse) has less effect on the overall pressure of the volume between the pump and the nozzle body.

The use of pulsing also may allow for two-dimensional patterned deposition, i.e., patterning across a substrate, such as where certain portions of a substrate are coated with a substantially uniform layer of material, while other portions remain substantially uncoated. For example, pulsed pressure may be used to achieve patterned or pixilated deposition, where each pulse of the pump produces a discrete region of deposited material on the substrate.

Figure 2:
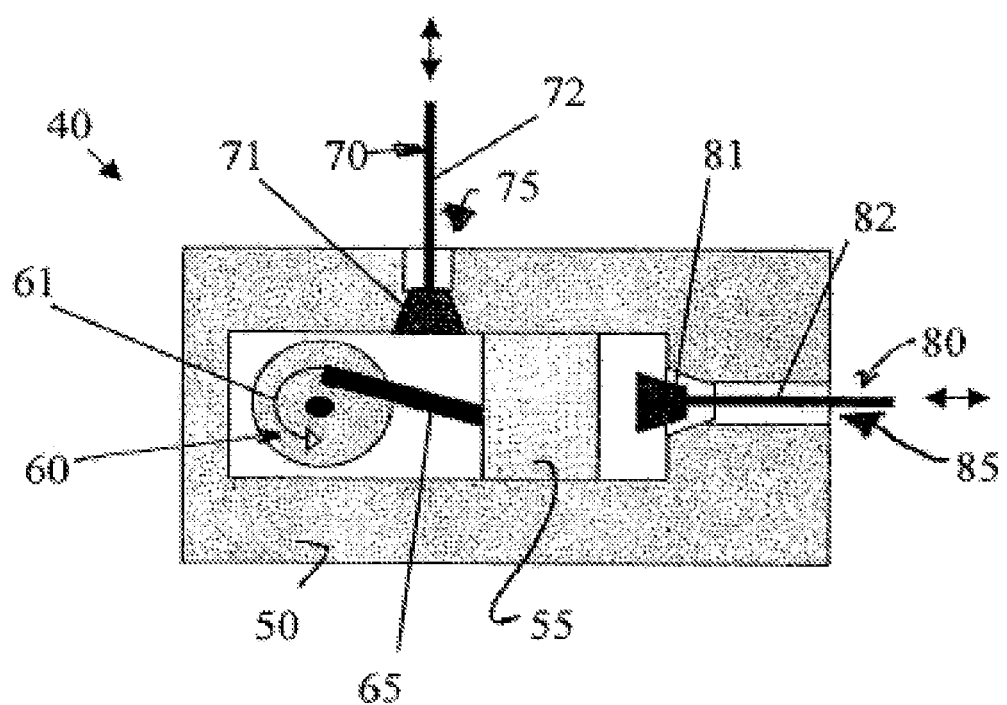
FIG. 2 illustrates a high temperature piston pump of an organic vapor jet printing system.

Although described above with reference to the example piston pump illustrated in FIG. 2, it will be understood that pressure pulses may be generated using a wide variety of other pump types, such as dosing pumps, MEMS-based pumps and pump chains, and other pumps as described herein. In general, a more squared deposition profile may be achieved because the flow of flux can be turned on and off relatively quickly since the volume of flux between the nozzle and the pump is relatively small and contains relatively little material. This effect may be greater in configurations where the pump is placed proximate to, or in immediate physical contact with the nozzle.

The use of a pump as described herein may decrease the occurrence of pressure drops through long run lines between the source and the nozzle. Thus, better nozzle flow may be achieved than in a comparable system without a pump. The pump also may reduce or prevent cold spots in the flux, thus reducing the chance of premature condensation of the organic flux prior to dispensing from the nozzle. The use of a pump also may allow for an improved deposition profile. For example, a more "squared" deposition profile may be achievable, allowing for more efficient use of substrate surface area.

The flux 20 is directed to a substrate 36 by the nozzle body 25. The substrate 36 is mounted to a translating substrate stage 38 that moves the substrate 36 in relation to the nozzle body 25. The substrate stage 38 also cools the substrate to a temperature sufficient to cause deposition of the organic material onto a surface of the substrate, thereby forming an organic film on the substrate. The temperature of the substrate may be maintained low enough that the concentration of organic vapor molecules in a small volume directly above the cooled substrate can be approximated as zero for modeling purposes. All regions of the system 1 are hot except for the nozzles, the substrate, and the substrate stage.

A high temperature piston pump 40 is illustrated in FIG. 2. Within a casing 50 is a piston 55 connected to a piston crank 60 by a connecting rod 65. As the piston crank 60 rotates about its axis in, e.g., direction 61, the piston reciprocates linearly within the inner cylinder of the casing 50. During an input stroke, an input valve 70, formed by a stopper head 71 and a corresponding seat in the casing 50, in a flux inflow region 75 is opened, allowing the flux to enter the internal cylinder in a volume disposed on the side of the piston 55 opposite the piston crank. It is noted in this regard that FIG. 2 is not drawn to scale. An output valve 80, formed from a stopper head 81 and a corresponding seat in the casing 50, in a flux outflow region 85 is closed during the input stroke. During an output stroke (e.g., compression stroke), the input valve 70 is closed and the output valve 80 is opened, allowing an amount of the flux to be pushed out of the cylinder. The valves 70, 80 are operated by a cam system that actuates the stopper heads 71, 81 via actuator rods 72, 82. However, it should be appreciated that movement of the stopper heads 71, 81 may be achieved in any, e.g., conventional, manner. An actuator mechanism to move the actuator rods 72, 82 and heads 71, 81 may be of any, e.g., conventional, type. Examples of automated actuator mechanisms include, but are not limited to, pneumatic, hydraulic, and electronic. Electronic mechanisms include, e.g., stepper motors that can be digitally controlled, allowing precise control of the stopper head positions.

The stopper heads 71, 81 and the associated regions of the casing 50 have corresponding or compatible shapes. Thus, when the stoppers arc positioned in the closed position, the stopper heads 71, 81 seal the pump at the flux inflow region 75 and the flux outflow region 85, respectively. The contact seal between the stopper heads 71, 81 and the casing 50 is sufficient to cut off the flow of flux.

The shape of the stopper heads only require that those portions of the stopper heads that contact the casing 50 have a shape that will seal the flux inlet or outlet, and prevent any flux flow therethrough.

The shapes of the stopper heads 71, 81 provide for the self-centering of the stopper heads 71, 81 within the corresponding surfaces of the casing 50. Any shape that will allow at least a portion of the stopper heads 71, 81 to enter and form an intimate seal with the casing 50, cutting of the flux flow, may be provided. For example, a portion of the stopper heads may be frustroconical and the casing 50 surface may circular in shape. As the stopper heads are brought into a closed position, the frustroconical shape of the stopper will guide the stopper into the outlet, naturally resulting in a self-centered alignment. Stopper head shapes may include, e.g., generally spherical, hemispherical, and conical/frustroconical shapes. The edges of the casing 50, as shown in FIG. 1, are beveled to match the shapes of the stopper heads 71, 81.

The stopper heads 71, 81, actuator rods 72, 82, and casing 50 may each be made from any appropriate, e.g., conventional, material that can withstand the temperature and pressure conditions to which the pump 40 is subjected, and can provide a seal between the heads 71, 81 and casing 50. These materials may include, e.g., aluminum, titanium, stainless steel, glass, quartz, ceramics, composites, etc.

The piston 55 may be lubricated with graphite to facilitate sliding within the inner cylinder of the casing 50. Alternatively, hard anodized coatings on the piston 55 and casing 50 may eliminate the need for lubrication. If uncoated metal is used, however, the piston material and the casing material may be different in order to reduce the likelihood of seizing.

Figure 3:
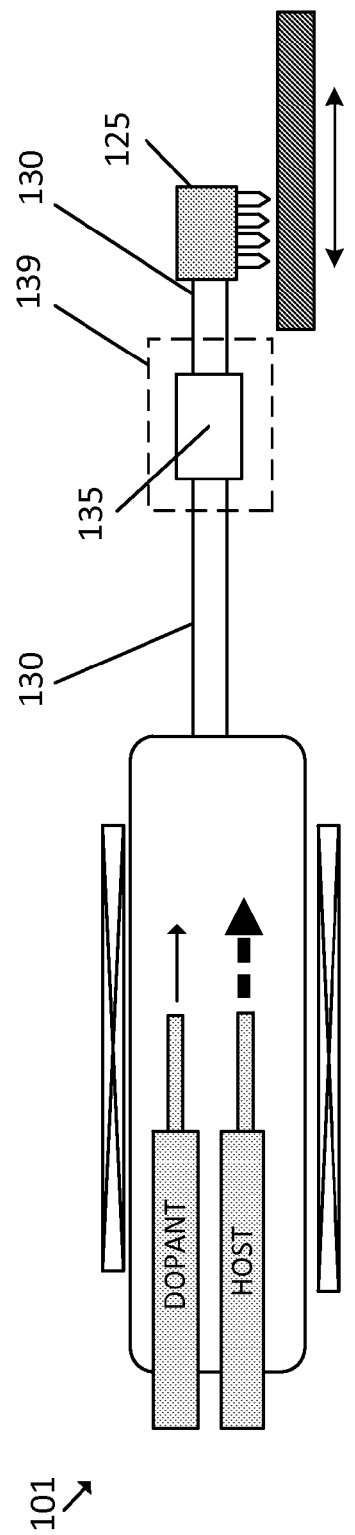
FIG. 3 illustrates an organic vapor jet printing system.

An OVJP system 101 is illustrated in FIG. 3. The OVJP system 101 includes many features analogous to those illustrated in FIG. 1. The OVJP system illustrated in FIG. 3, however, has a longer transport line 130, with the pump 135 disposed at a position proximate to the nozzle body 125. Disposing the pump 135 close to the nozzle end of the system may have advantageous effects, since it allows for pressure to be increased just before the nozzle tip. This may further reduce or completely prevent the occurrence of pressure drops and cold spots in the nozzle flow. A thermal bath 139, shown schematically, regulates the temperature the pump 135.

The heated chambers in FIGS. 1 and 3 generally provide a source pressure of 1 torr (mmHg) or less, characteristic of similar chambers of many OVPD systems. Thus, the input pressure into the pumps 35, 135 is 1 torr or less. In order to obtain a satisfactory mass flow rate of the vapor to the nozzles, a nozzle back pressure of approximately 10 torr may be required. The pressure differential may therefore need to be at least an order of magnitude (10×) in order to supply adequate pressure to the nozzles. Thus, the pressure differential between the outlet and the inlet of each pump 35, 135 may be a factor of 10 or more. For example, the pressure differential may be a factor of 50 or more to provide an even greater operating envelope.

The pump 35, 135 may be, e.g., a MEMS high frequency gas micropump in accordance with that described by Aaron A. Astle et al., "Theoretical and Experimental Performance of a High Frequency Gas Micropump," 134 Sensors and Actuators A: Physical 245 (2007), which is expressly incorporated herein in its entirety by reference thereto. For example, a 9-stage pump similar to that described by Astle et al. may be employed in the context of the present system in order to provide a 10× pressure differential between the pump outlet and the pump inlet.

Figure 4:
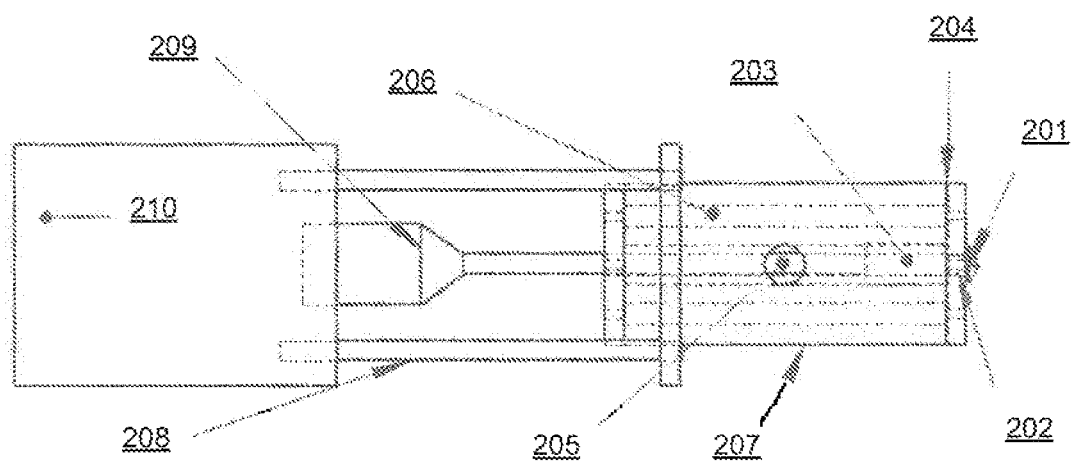
FIG. 4 illustrates a dosing pump of an organic vapor jet printing system.

The pump 35, 135 may be a dosing pump such as shown in FIG. 4. A dosing pump receives a volume of low pressure organic vapor from a source and delivers it in an elevated pressure pulse. For example, the pump may cycle once for each dosage of material delivered. In operation, a linear actuator 210 drives a piston 203, such as by means of a pushrod 209. The actuator 210 may be held in proximity to the rest of the pump by a brace 208. The linear actuator may be, for example, a solenoid, electrostatic actuator, or any other suitable actuator. The piston 203 compresses process vapor fed into the pump through a side port 205 on its downstroke. Vapor compressed by the piston is distributed by a plenum 202 to a nozzle assembly 201. The nozzle assembly 201 includes one or more nozzles and is attached by an end cap 204. In some configurations, the piston may be undersized relative to the cylinder block 207 to reduce lubrication requirements. This may be especially suitable for pumping low pressure, high temperature gases, such as gas at less than about 50 Torr and more than about 300 C. One or more cartridge heaters 206 may be used to maintain a desired temperature within the pump As another example, the pump 35, 135 may be a micropump chain. Chains of micro-pumps made using microelectromechanical systems (MEMS) technology can be employed to pressurize and dose organic vapor for continuous or patterned printing, such as pixilated printing. An example of suitable MEMS vapor pumping technology is described in Aaron A. Astle et al., "Theoretical and Experimental Performance of a High Frequency Gas Micropump," 134 Sensors and Actuators A: Physical 245 (2007). While the specific pump described therein employs electrostatic actuation, it should be noted that other methods, such as piezoelectric actuation, may be used.

Figure 5:
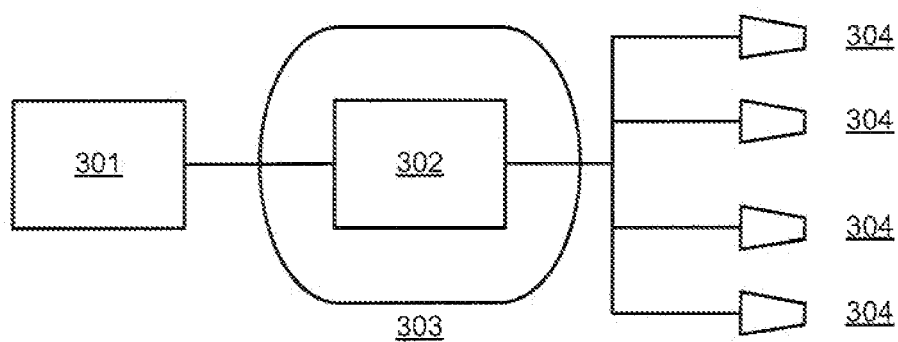
FIG. 5 illustrates a micro-pump configuration of an organic vapor jet printing system.

FIG. 5 shows an example micro-pump chain. A first stage micro-pump 301 is used to compress a large volume of relatively low pressure vapor to a higher pressure. A booster micro-pump 302 further increases the pressure of process vapor. One or more booster micro-pumps 302 may be arranged in a booster micro-pump chain 303 to increase the pressure of process vapor in steps, with each pumping step being configured to achieve higher pressure and lower volume. In some configurations, parallel elements may be split to drive clusters of nozzles at different flow conditions. In a specific example, the first stage micro-pump 301 may be configured to compress a large volume of vapor at an initial pressure of less than about 10 Torr to a slightly higher pressure, such as about 15-20 Torr. A series of booster micro-pumps may then achieve an output pressure of 100 Torr or more. One or more nozzles 304 are connected to the output of the micro-pump chain. The nozzles may be connected singly or in parallel, and may be configured in any suitable arrangement such as a linear or two-dimensional array.

Figure 6:
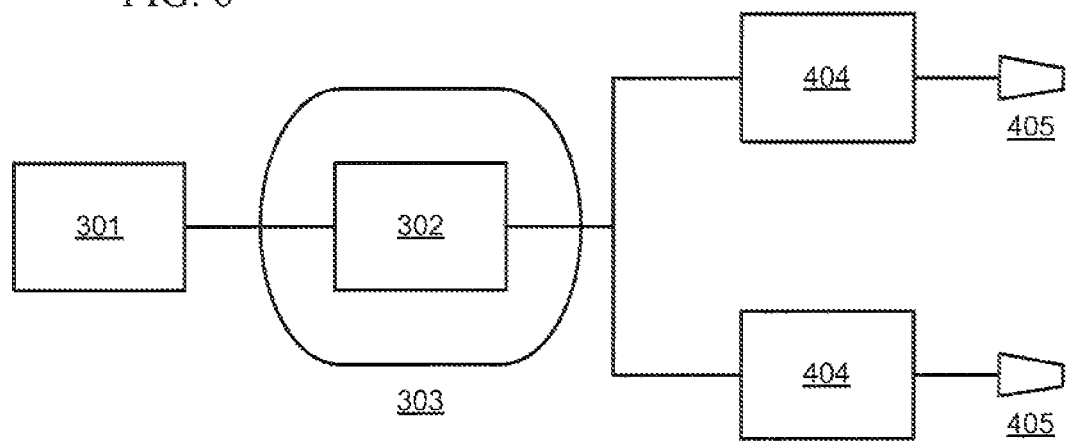
FIG. 6 illustrates a micro-pump configuration with final stage pumps of an organic vapor jet printing system.

In some configurations, one or more final stage pulse/dose pumps may be used to further control the flow of vapor to the nozzles. FIG. 6 shows an example micro-pump chain having individual final stage pumps 404 connected to each nozzle 405. Typically, one final stage pump 404 is used to control the flow of vapor to one nozzle 405, as shown, although other configurations may be used. Configurations using final stage pumps 404 may be particularly suited to applications where two-dimension patterned printing, such as pixilated printing, is desired.

Figure 7:
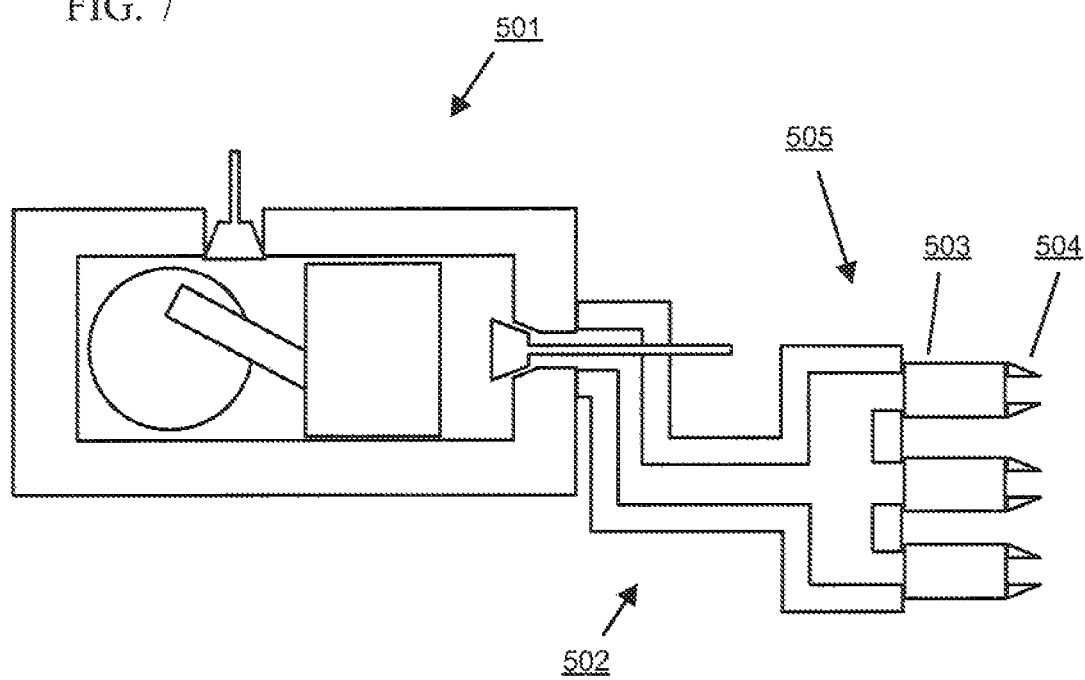
FIG. 7 illustrates a pump configuration of an organic vapor jet printing system.

As another example, the pump 35, 135 may be a pump arrangement as shown in FIG. 7. Such a configuration may use a piston pump 501, such as the pump 40 shown in FIG. 2, to initially compress the flux. Typical pressures of incoming feed flux may be on the order of about 1-10 Torr. The piston may then pump the flux into a heated manifold 502, typically at about 10 times the feed pressure. The manifold is connected to a print head 505 that includes, for example, MEMS pumps or valves 503. The MEMS pumps 503 can deliver pulses of organic vapor to individual nozzles 504 or clusters of nozzles. Configurations such as that shown in FIG. 7 may be used to combine the benefits of the relatively higher compression ratio and large displacement of the piston pump 501 with the relative compactness and high actuation speed, and on-chip integration capability of the MEMS pumps. As previously described, such a configuration also may allow for patterned deposition, such as deposition of a pixilated layer.

Although the pumps 35, 135 shown in FIGS. 1 and 3 each provide increased pressure for all of the nozzles of their respective OVJP systems, it should be appreciated that, according to other examples, each nozzle may have a dedicated pump or pumps. In such arrangements, pumps could, e.g., be stacked in arrays vertically over each nozzle, with each array being separately addressable electrically, thus allowing control similar to that of an ink jet printer. Further, the nozzles may be segmented into groups, each group having its own dedicated pump or pumps.

Although the present invention has been described with reference to particular examples and embodiments, it should be understood that the present invention is not limited to those examples and embodiments. Moreover, the features of the particular examples and embodiments may be used in any combination. The present invention therefore includes variations from the various examples and embodiments described herein, as will be apparent to one of skill in the art.

What is claimed is:

1. An organic vapor jet printing system, comprising:
   a heated chamber configured to produce an organic flux, the flux including a carrier gas and a vapor of an organic material;
   a source cell configured to introduce the vapor and the carrier gas into the heated chamber;
   a nozzle body configured to direct the flux to a substrate;
   a transport line disposed between the heated chamber and the nozzle body, the transport line configured to convey the flux from the heated chamber to the nozzle body; and
   a pump capable of generating pressure pulses in the flux, said pump located within the heated chamber and connected to the transport line between the source cell and the nozzle body, the pump configured to pump the flux from the chamber to the transport line and to the nozzle body,
   wherein said pump is capable of increasing a pressure of the organic flux before the organic flux exits the nozzle body.

2. The system of claim 1, further comprising a stage configured to translate a substrate with respect to the nozzle body.

3. The system of claim 2, wherein the stage is configured to cool the substrate to a temperature sufficient to cause deposition of the organic material onto a surface of the substrate to form an organic film on the substrate.

4. The system of claim 1, further comprising a heating element configured to regulate a temperature within the heated chamber.

5. The system of claim 1, wherein the nozzle body includes an array of nozzles.

6. The system of claim 1, wherein the pump is configured to cause pressure pulses in the flux.

7. The system of claim 6, wherein the organic material is deposited on a discrete region of the substrate when a pressure pulse is applied, and substantially no organic material is deposited when no pressure pulse is applied.

8. The system of claim 1, wherein the pump includes a piston.

9. The system of claim 8, wherein the pump includes a crank configured to actuate the piston.

10. The system of claim 8, wherein the pump includes a solenoid configured to actuate the piston.

11. The system of claim 1, wherein the pump includes a piezoelectric material.

12. The system of claim 1, wherein the pump is a micro-electromechanical system.

13. The system of claim 1, further comprising a thermal bath configured to regulate the temperature of the pump.

14. The system of claim 1, further comprising at least one additional source cell configured to introduce a vapor of at least one additional organic material into the heated chamber.

15. The system of claim 1, wherein the source cell is positioned non-completely within the heated chamber.

* * * * *